(12) United States Patent
Jackson

(10) Patent No.: US 6,656,017 B2
(45) Date of Patent: Dec. 2, 2003

(54) METHOD AND APPARATUS FOR CREATING AN OPEN CELL MICRO-ENVIRONMENT FOR TREATING A SUBSTRATE WITH AN IMPINGEMENT SPRAY

(76) Inventor: David P. Jackson, 22328 W. Barcotta Dr., Saugus, CA (US) 91350

( * ) Notice: Subject to any disclaimer, the term of this patent is extended or adjusted under 35 U.S.C. 154(b) by 0 days.

(21) Appl. No.: 10/132,095

(22) Filed: Apr. 24, 2002

(65) Prior Publication Data

US 2002/0155792 A1 Oct. 24, 2002

Related U.S. Application Data

(60) Provisional application No. 60/286,104, filed on Apr. 24, 2001.

(51) Int. Cl.$^7$ ................................................ B24C 3/12

(52) U.S. Cl. .............................. 451/39; 451/40; 451/2; 451/81; 451/89; 134/7; 134/10

(58) Field of Search ............................ 451/39, 40, 81, 451/2, 89; 134/7, 10, 12–13, 104.2–104.4, 109, 198–200

(56) References Cited

U.S. PATENT DOCUMENTS

| | | | |
|---|---|---|---|
| 4,312,156 A | * 1/1982 | McWhorter | 451/81 |
| 4,513,597 A | * 4/1985 | Kimoto et al. | 72/53 |
| 4,793,103 A | * 12/1988 | Baumgart | 451/81 |
| 4,936,922 A | 6/1990 | Cherry | |
| 5,062,898 A | 11/1991 | McDermott et al. | |
| 5,315,793 A | * 5/1994 | Peterson et al. | 451/2 |
| 5,354,384 A | 10/1994 | Sneed et al. | |
| 5,409,418 A | 4/1995 | Krone-Schmidt et al. | |
| 5,725,154 A | 3/1998 | Jackson | |
| 5,766,061 A | * 6/1998 | Bowers | 451/89 |
| 6,066,032 A | * 5/2000 | Borden et al. | 451/80 |
| 6,099,396 A | * 8/2000 | Krone-Schmidt | 451/80 |

OTHER PUBLICATIONS

"Achieving Chemical and Particulate Isolation through the use of Minimenvironments", A. Kaiser, Microcontamination, Apr. 1994.

* cited by examiner

*Primary Examiner*—George Nguyen
(74) *Attorney, Agent, or Firm*—Sonnenschein Nath & Rosenthal LLP

(57) ABSTRACT

The present invention is a method and apparatus for providing a low-cost and less complex micro-environment for treating a substrate using an impingement cryogenic or steam spray jet. A substrate and fixture is contained within an open-architecture prophylactic or cleaning cell whereupon the substrate and fixture is continuously bathed in a regenerated and re-circulating stream of filtered, inert, dry, heated and ionized atmosphere which bathes both the entire substrate and fixture. This prevents the intrusion of contaminating ambient atmospheres onto critical surfaces. The cleaning cavity is constantly regenerated and re-circulated through the cleaning cell to maintain a majority of the clean atmosphere wherein the clean cavity is pressurized slightly with a small volume of clean dry air or inert gas to prevent the intrusion of ambient atmosphere into the cleaning cell. A small exhaust duct removes the partial pressure of atmosphere from the open regions of the cleaning cavity, capturing the escaping cavity atmosphere. The exemplary spray cleaning applicator of the present invention provides a majority of the make-up atmosphere required to operate the cleaning cell. The treated surface is thus isolated and protected from the ambient atmosphere and contaminants contained therein prior to, during and following application of a treatment spray. The present invention allows for the simultaneous application of a variety of conventional surface treatment agents such as dry steam or snow to a critical surface. Finally, the present invention controls and maintains the quality of the environment immediately within the vicinity of the substrate being treated, and the ambient atmosphere.

1 Claim, 12 Drawing Sheets

METHOD AND APPARATUS FOR CREATING AN OPEN CELL MICRO-ENVIRONMENT FOR TREATING A SUBSTRATE WITH AN IMPINGEMENT SPRAY

This application claims priority to U.S. Provisional Patent Application No. 60/286,104, filed Apr. 24, 2001.

BACKGROUND OF INVENTION

The present invention relates generally to the field of cleaning or treating miniature electromechanical device surfaces with cryogenic impingement sprays. More specifically, the present invention relates to the field of environmental control for performing cryogenic spray cleaning processes. Conventional precision cleaning processes using cryogenic particle impingement sprays such as solid phase carbon dioxide require control of the atmosphere containing a treated substrate to prevent the deposition of moisture, particles and other such contaminants onto cleaned surfaces during and following cleaning treatments.

Environmental control is required because of localized atmospheric perturbations created by the low temperatures and high velocities which are characteristic of these impingement cleaning sprays.

For example, snow particles having a surface temperature of −100 F. and traveling through the space between the spray nozzle and substrate are continuously sublimating in transit and upon impact with a substrate surface. This rapidly lowers local ambient atmospheric temperature—causing the contaminants contained therein to condense or "rain-out" of the local atmosphere and onto treated substrate surfaces during or following spray treatments. Moreover, the cleaning spray stream exhibits lower internal pressure than the 3 surrounding atmosphere (Bernoulli Principle) and creates venturi currents adjacent to the flow of the stream. These venturi currents cause the local atmosphere surrounding the stream to collapse into the spray stream above the substrate—thus entraining and delivering a mixture of cleaning spray and atmospheric constituents to the substrate. Finally, static charge build-up and accumulation are common to cryogenic sprays due the dielectric and tribocharging characteristics. This presents two problems—potential device damage from electrostatic overstress (EOS) or discharge (ESD) events and attraction of atmospheric contaminants to treated substrates via electrostatic attractive forces.

Micro-environmental control technology is well established and many techniques have been developed over the years to isolate a process, a substrate or a worker. The purpose of isolation can include protecting workers from toxic chemicals, protecting clean rooms from particles, or protecting delicate processes and substrates from the outside environment, among many others.

There are many examples of techniques to control thermal and electrostatic effects during cryogenic impingement sprays using secondary heated or ionized jets or sprays above the substrate surface and delivered either independently or as a component of the cryogenic spray have been used commercially. In U.S. Pat. No. 5,409,418 and U.S. Pat. No. 5,354,384, both teach direct heated or ionized gas impingement techniques and apparatus for heating, purging and deionizing substrate surfaces.

'384 teaches the use of a heated gas such as filtered nitrogen to provide a pre-heat cycle to a portion of a substrate prior to snow spray cleaning the same portion of said substrate, and a post-heat cycle of same said portion following snow cleaning. This approach relies on "banking heat" into the substrate portion prior to cryogenic spray cleaning by delivering a heated gas stream to a portion of substrate to prevent moisture deposition and adding heat from a heated gas following cryogenic spray treatment. The '384 invention is primarily useful for removing high molecular weight materials such as waxes and adhesive residues from surfaces by partially melting or softening them prior to spray treatment—in essence weakening cohesive energy. However, this approach does not work well for most substrate treatment applications. This is because many materials, or the portions thereof, being cleaned have low thermal conductivity and low mass or because highly thermal conductive materials rapidly lose heat to the sublimating snow during impact. This creates localized cold spots on even a mostly hot bulk substrate, which is the phenomenon for many substrates and surfaces being treated. Examples include ceramics, glasses, silicon and other semi-conductor materials, as well as most polymers. In addition, many electromechanical devices being cleaned are very small—providing no appreciable mass for storing heat. Examples include photodiodes, fiber optic connectors, optical fibers, end-faces, sensors, dies, and CCD's, among many others.

Most significantly, directing a heating spray, or any secondary fluid for that matter, directly at or incident with the substrate surface to be cleaned prior to, during and/or following cryogenic cleaning spray treatments causes the entrainment, delivery and deposition of atmospheric contaminants as discussed above. This necessitates housing the cryogenic spray applicator, substrate and secondary gas jets in large, bulky and complex environmental enclosures employing HEPA filtration and dry inert atmospheres such as taught for example in U.S. Pat. No. 5,315,793, which teaches a fully enclosed environmental chamber containing a snow spray applicator, automation, and thermal control system.

In the '418 invention, an apparatus is taught for surrounding the impinging cryogenic spray stream with an ionized inert gas. Using this invention, it is proposed by that surrounding a stream of solid-gas carbon dioxide with a circular stream of ionized gas and applying the two components to the substrate simultaneously controls or eliminates ESD at the surface during impingement. However, as also with '384 invention above, the '418 secondary stream entrains, delivers and deposits atmospheric contaminants upon the substrate surfaces being treated. Moreover, contact of the ionizing gas with the stream prior to contact with the surface rapidly eliminates ion concentration—highly degrading the performance of such an approach to controlling ESD. Still moreover, using the ionizing spray of '418 independent of the snow spray and which is directed at an angle which is incident to the surface will further re-contaminate the substrate unless, as taught in '793, the entire operation is performed in a controlled HEPA-filtered chamber.

As devices become smaller and their complexity increases, it is clearly desirable to have a improved processing technique, including a method and apparatus, that aids in using environmentally safe cleaning sprays to remove unwanted organic films and particles. It is desirable to have a technique that prevents additional particles and residues from being deposited on critical surfaces during application of said impingement cleaning sprays. The complete environmental control technique should include all of the basic environmental controls of thermal control, ionization control, and providing a dry and particle free cleaning atmosphere, but not negatively impacting the performance of the impinging cleaning spray. From the above, it is seen that a method and apparatus for use with impingement cleaning devices which provides micro-environmental control of precision electromechanical substrates during application that is low-cost, easy to use, adaptable and reliable is desired. As such, there is a present need to provide a method and apparatus for protecting a substrate from atmospheric contaminants and tribocharging effects during application of cryogenic cleaning sprays, and other non-cryogenic jet cleaning impingement sprays, which is low-cost, simple and adaptable to a variety of substrates and applicators. Moreover, there is a present need for an alternative and indirect environmental management process and apparatus whereas the spray applicator and other components are outside of the cleaning zone—thereby not posing a direct contamination threat to the critical substrate surfaces. Still moreover, there is a need for an environmental control process that does not produce a direct impingement spray upon the critical surfaces being cleaned and provides heat, ions and clean-dry atmosphere to the critical surfaces and indirectly removes contaminants discharged from the surfaces during spray cleaning operations. Finally, there is a need for an environmental control apparatus and method which can be used in any type of factory environment—so as to not produce harmful contamination of adjacent factory assembly operations with particles and cleaning gases.

SUMMARY OF THE PRESENT INVENTION

The present invention provides a low-cost, adaptive and selective method and apparatus to protect a device being subjected to a cryogenic impingement spray such as snow cleaning or dry steam spray. Examples include cleaning fiber optic connector end-faces, photodiodes, CCD's and many other substrate cleaning applications. The present invention overcomes the limitations of conventional environmental control measures cited herein by providing a re-circulating localized microenvironment encompassing the entire critical substrate and holding fixture—a laminar sheath of temperature controlled, ionized inert dry gas which is delivered from behind the substrate surfaces being treated and which flows at an angle which is not incident to the substrate surface being treated. A relatively small partial pressure of clean dry air is continuously introduced into the cleaning cell to create a slight positive pressure within the cleaning cell, preventing the intrusion of ambient atmosphere. A localized exhaust plenum is used to extract the partial pressure of atmosphere escaping from the cleaning cell so as to prevent this atmosphere from diffusing into the local environment—thus providing a balanced micro-environment using much less space, less clean air and less complex equipment than conventionally used to achieve the same results. The apparatus of the present invention comprises an open cell prophylactic—a protective device within which is contained a substrate and mounting fixture or which a substrate is placed therein, which provides an instantaneous curtain or sheath of controlled atmosphere. The prophylactic may be constructed of any variety of materials including metals, ceramics, glasses and conductive or ESD dissipative polymers, and combinations thereof, in which a cavity is created to accept the fixture" and substrate. The cavity is selectively open to the ambient atmosphere and is ported to allow an inert pressurized and heated atmosphere (with respect to the ambient atmosphere—outside the cavity), and flows within and envelops in a concurrent direction, in relation to the impinging spray, the entire fixture and substrate contained therein. The clean cavity atmosphere recirculates between the space comprising adjacent cavity walls—the substrate thus being contained between the cavity walls and protected from ambient atmosphere in a sheath of clean air. Virtually any geometrically shaped cavity may formed about the surface and fixture to be treated. The substrate may be held within the purging cavity by means of a vacuum, manually held from above or held, articulated within the cavity by an external robot, or conveyed into the cleaning cell using an automated track. A re-circulated atmosphere, which may be ionized, flows at a controlled velocity in a manner consistent with the geometry of the cavity and substrate and fixture being treated to so as not to produce undue turbulence and erratic flow lines within the cavity. Thus the airflow may be circular, rectangular or any other shape as desired to form the appropriate flow patterns within the open cell cavity. Still moreover, the prophylactic may be designed to be interchangeable to accommodate any number of substrates and substrate geometries, such as reel-to-reel substrates, and may be integrated to the cryogenic spray applicator in such a manner as to allow for automatic placement over a substrate and performance of simultaneous spray cleaning operations.

The present invention provides both physical (structural) and chemical (ionic) ESD prevention and control components—a "Faraday Cage" of ions which surrounds and protects the substrate and fixture from electrical charges and radiation during spray treatments. Using exemplary coaxial TIG-Snow and TIG-Steam cleaning devices in combination with the present invention, both of which are described in detail within issued patents or pending patent applications, clean dry atmosphere is continuously introduced into the cleaning cell. As such, no significant additional clean atmosphere is required to make-up and maintain both the positive pressure and quality of the cleaning cell environment during cleaning operations.

Finally, the present invention provides a process and apparatus, which is adaptable to automated cleaning and assembly operations, and is a cost- and performance-effective alternative to fully-enclosed environmental enclosures. The present invention may be adapted to a robotic arm and integrated with the impingement cleaning spray applicator to provide automatic insertion, cleaning and treatment, and de-insertion of substrates—an in-situ ultraclean microenvironment for any type of production or assembly line.

Thus the present invention overcomes the limitations of prior art by providing an apparatus that uses less inert gas, is open architecture to allow for batch, in-line or online automation and manual cleaning operations, recirculates a majority of the clean atmosphere contained within the cleaning cell, is small enough to be used with any type of in-line automation system, is less complex and costly and can be configured in various physical forms to meet any batch or automated cleaning system design, and is a clean design and process that can be used within critical factory environments such as clean rooms.

A further understanding of the nature and advantages of the invention may be realized by reference to the latter portions of the specification and attached drawings.

BRIEF DESCRIPTION OF THE DRAWINGS

These and other objects and advantages of the present invention will be obvious to those of ordinary skill in the art after having read the following detailed description of the preferred embodiments, which are illustrated in the various figures.

FIG. 5b is a graphical depiction of the atmospheric flow patterns for the exemplary table-top and open-top cleaning cell of FIG. 4a.

DETAILED DESCRIPTION OF THE INVENTION

Figure 1A:
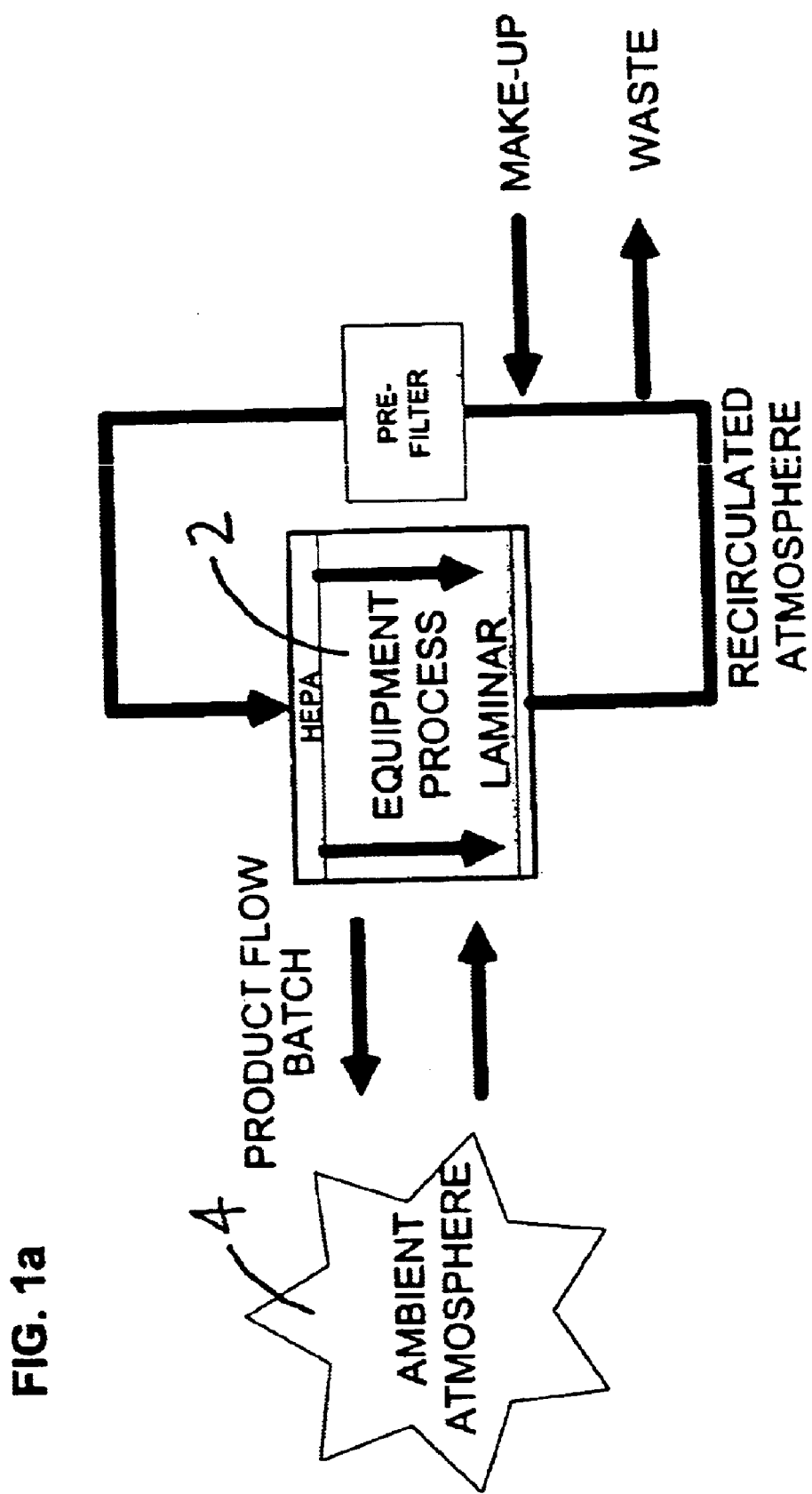
FIG. 1a is an exemplary conventional isolation technique utilizing a closed cabinet with re-circulating laminar flowing filtered air.

Referring to FIG. 1a, an exemplary conventional isolation technique employs a fully enclosed, controlled environment work stations with a HEPA-Filtration system. In these systems, the entire cleaning system equipment and process is integrated inside the clean chamber (2), which requires careful selection and design of internal components and subassemblies so as to not create particle contamination during operation. This design isolates the equipment, process and substrates from the outside environment (4) making it suitable in any type of ambient factory environment—controlled or uncontrolled. However, this approach is the most complex and costly of all isolation techniques and only allows for batch product flow through the system. This approach is best exemplified by the commercial snow cleaning system marketed by ATS-EcoSnow Systems, Livermore, Calif.

Figure 1B:
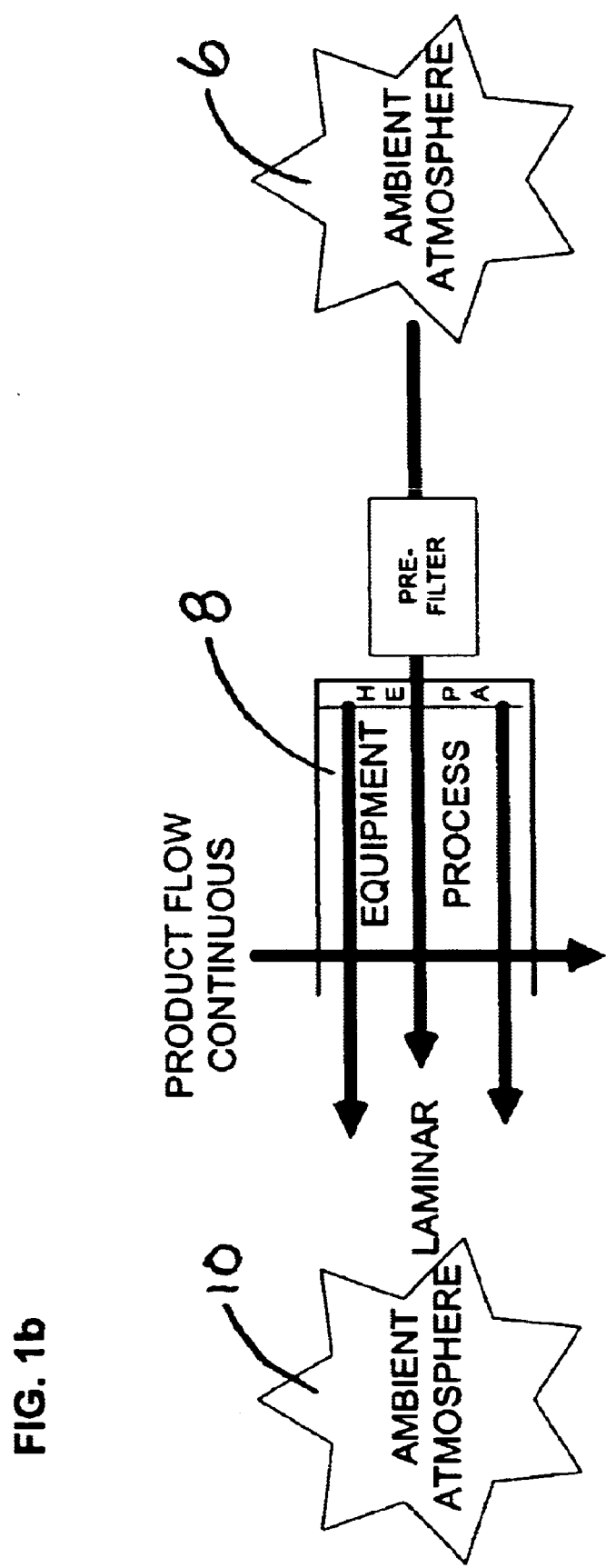
FIG. 1b is an exemplary conventional isolation technique utilizing a open work bench with laminar flowing filtered air.

Referring to FIG. 1b,—an exemplary conventional isolation technique employs an open and unitized work bench with vertical or horizontal flow HEPA-Filtration. In these systems, the work station flows clean air over a clean area comprising, for example, a table-top incorporating a cleaning system, automation and subassemblies. This approach is similar to that described in FIG. 1a, except that this approach is not suitable for use within highly controlled environments such as Class 100 clean rooms. Ambient atmosphere (6) is filtered and flows over the equipment and process (8) and is discharged back into the ambient atmosphere (10). Although this approach allows for incorporating a continuous conveyor for in-line or on-line applications, it suffers from lack of overall efficiency since the clean atmosphere is continuously created and discharged into the ambient environment.

Figure 1C:
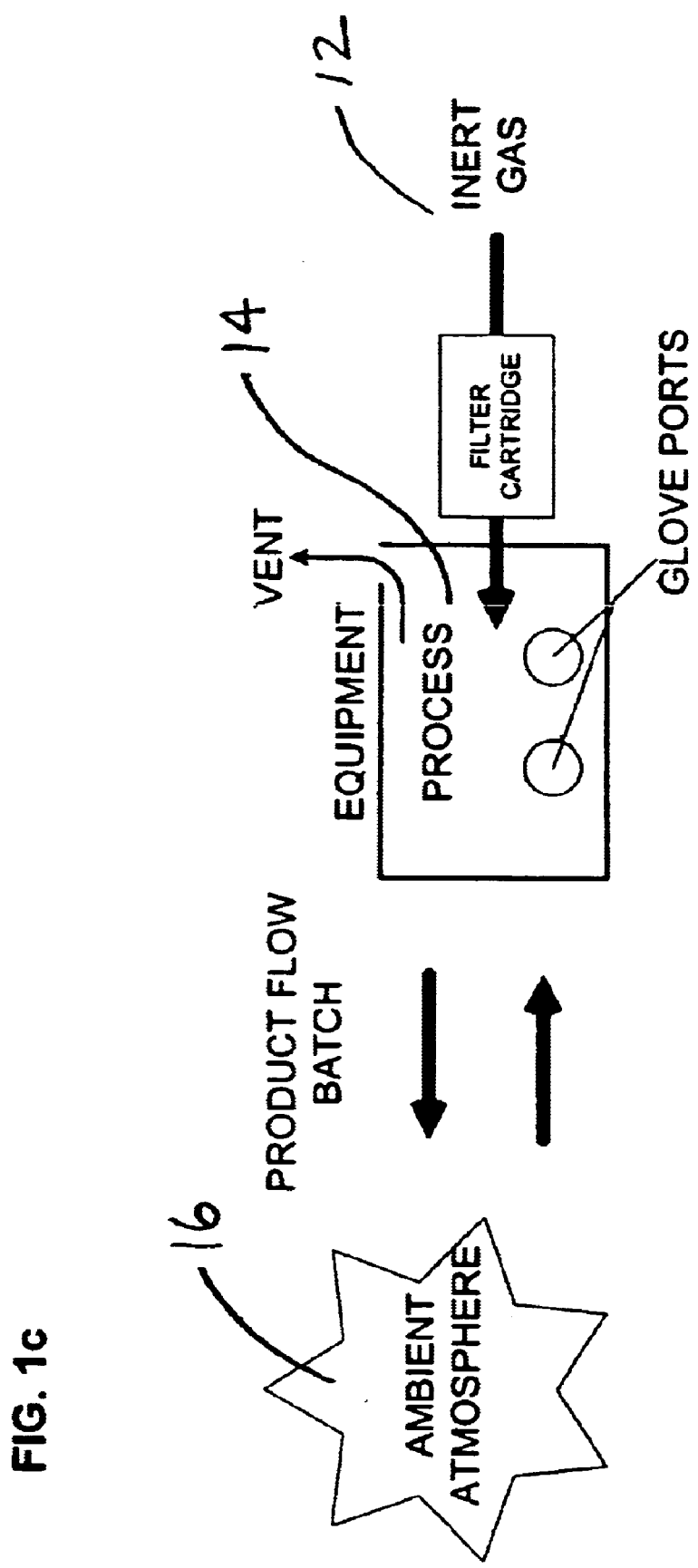
FIG. 1c is an exemplary conventional isolation technique utilizing a closed glove box with filtered purge gas.

Referring to FIG. 1c, an exemplary conventional isolation technique employs a glove box with inert gas purging. In these systems, the work cabinet is continuously purged with clean inert gas (12), wherein the substrate is placed into the cabinet (14) through some type of door and spray cleaned. This approach also suffers from loss of controlled atmosphere to the ambient atmosphere (16) and does not allow for in-line or on-line automation of the cleaning operation.

Figure 1D:
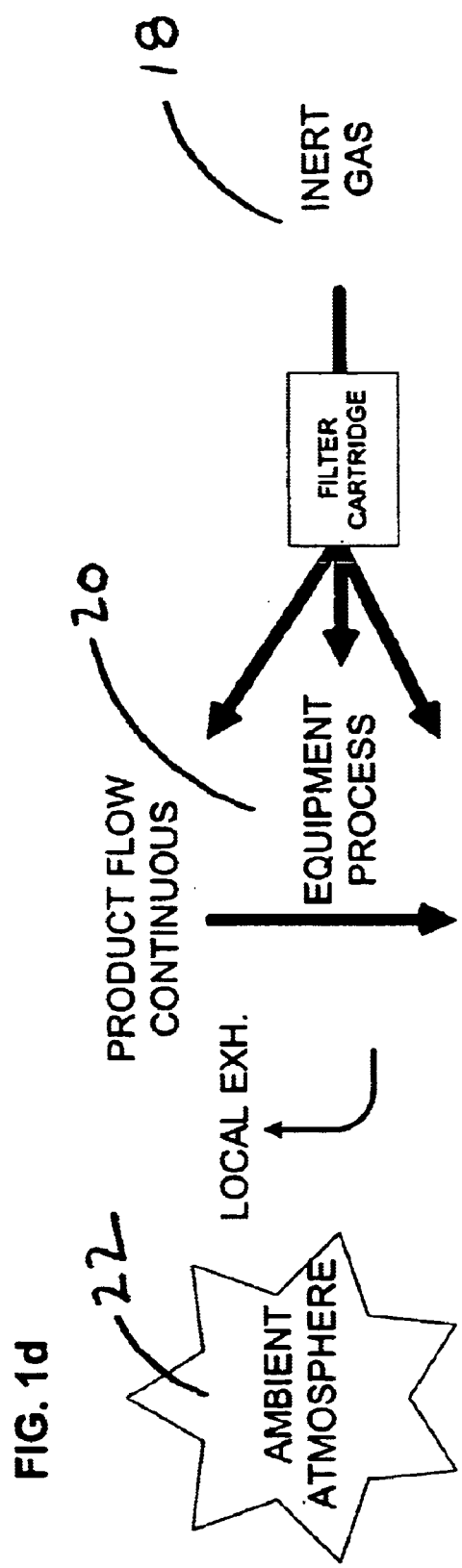
FIG. 1d is an exemplary conventional isolation technique utilizing an inert filtered blanketing gas.

Referring to FIG. 1d, an exemplary conventional isolation technique employs a localized inert gas blanket to provide a somewhat controlled atmosphere over the substrate being processed. In this approach, ionized inert and filtered air (18) is blown over the substrate, equipment and process (20) being cleaned producing a virtually clean atmosphere in the vicinity of the process which then is diffused into the ambient atmosphere (22). This approach is the least complex and allows for any type of in-line or on-line automation. However, this approach is not desirable for clean room operations and is not cost effective due to the loss of the controlled atmosphere.

Figure 2A:
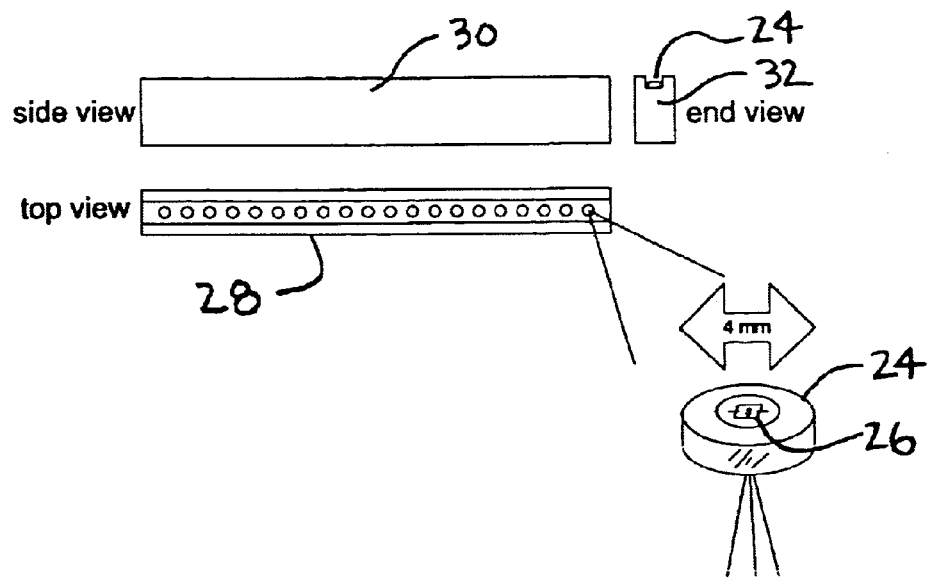
FIG. 2a is an exemplary photodiode substrate and Auer boat fixture for use with the present invention.

Referring to FIG. 2a, an exemplary substrate and fixture for use with the present invention comprises an Auer Boat filled with photodiodes. As shown in the figure, small photodiodes (24) containing a small chip (26) which is the target(s) to be cleaned are aligned in a single row (top view) of the Auer Boat (28). The Auer Boat sits vertically (30) and the end view (32) of the Auer Boat shows the photodiodes (24) recessed into the top of the fixture (32).

Figure 2B:
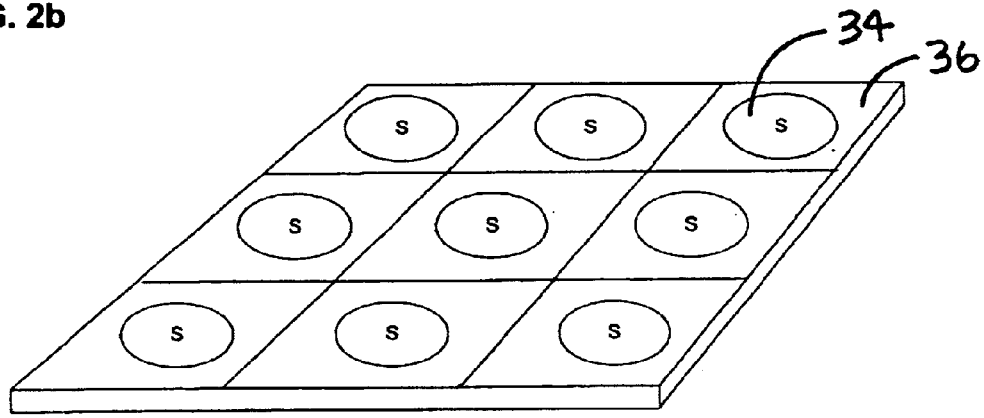
FIG. 2b is an exemplary wafer substrate and tray fixture for use with the present invention.

Referring to FIG. 2b, an exemplary substrate and fixture for use with the present invention comprises a tray filled with substrates. As shown in the figure, an array of substrates (34) on compartmentalized on a tray (36). The substrate (34) may need cleaning of the entire substrate or portions of the substrate thereof.

Figure 2C:
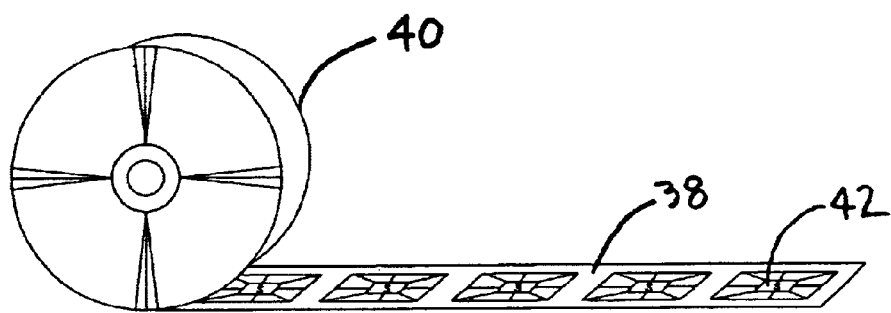
FIG. 2c is an exemplary lead frame substrate and reel fixture for use with the present invention.

Referring to FIG. 2c, an exemplary substrate and fixture for use with the present invention comprises a reel containing a roll of lead frames. As shown in the figure, a roll of lead frames (38) in wrapped onto a reel (40). The lead frames (38) contain a critical surface portion (42) which requires cleaning.

Figure 3A:
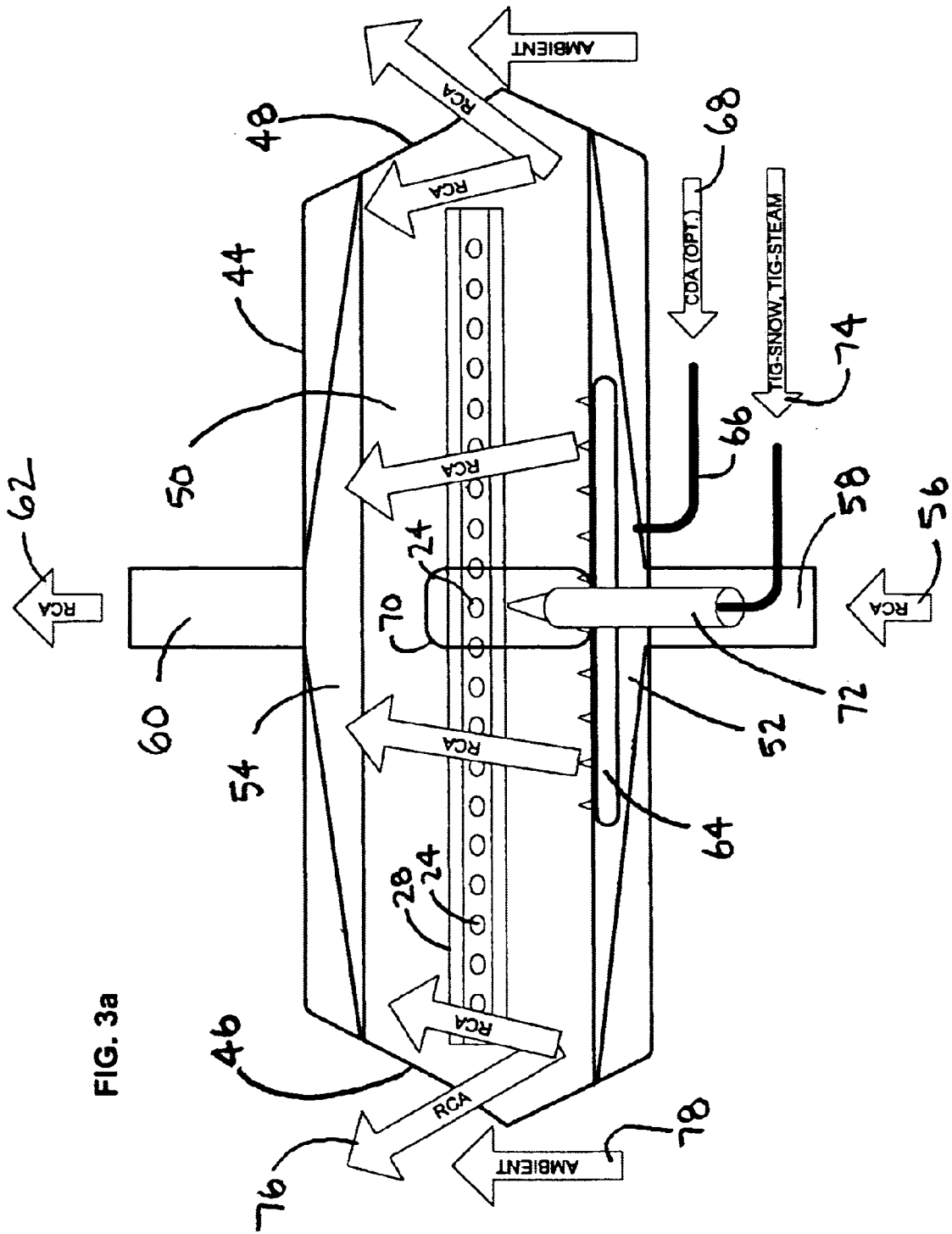
FIG. 3a is a graphical depiction of a top view of an exemplary cleaning cell, which shrouds a portion of a conveyor line, showing clean dry atmospheric gas flow patterns within the cell and emanating from the cell into the ambient atmosphere.

Referring to FIG. 3a, an exemplary apparatus of the present invention comprises a polygonal prophylactic housing or shroud (44). In this top view, the shroud is designed to have an open inlet (46) for insertion of the exemplary Auer Boat (28) containing the photodiodes (24) described in FIG. 1a. The exemplary shroud (44) also contains an open outlet (48) for de-insertion of the exemplary fixture (28) during processing. The present apparatus allows for continuous feeding of the Auer Boat through the internal cavity (50) of the shroud (44). The internal cavity (50) is bounded by an inlet regenerated clean air plenum (52) from the clean air return plenum (54). The inlet clean air plenum (52) is fed with a regenerated clean atmosphere (56) through an inlet pipe (58) from a regeneration blower (not shown). The return plenum (54) is connected to an outlet pipe (60) for containing and delivering re-circulated clean air (62) to the regeneration-blower (not shown). The exemplary apparatus contains an internal ionizing bar (64) within the inlet manifold (52) and an optional inert gas purge line (66) which feeds clean dry air (68) as make-up for losses through the inlet port (46) and outlet port (48). The exemplary apparatus contains an opening (70) in the upper hemisphere through which is inserted the exemplary TIG-Snow or TIG-Steam spray applicator (72), which is fed with an composite mixture of clean gas and snow or steam (74) and is described in detail in U.S. patent'154 and a pending patent application. The exemplary spray applicator (72) is directed at a suitable angle and distance from the exemplary substrate (24) to perform spray cleaning or treatment operations as the Auer Boat fixture (28) is indexed or conveyed continuously through the clean cavity (50). The arrows (76) designated as "RCA" indicate the flow patterns for re-circulated or regenerated clean air within the cavity and from the cavity in relation to the ambient atmosphere air flow pattern (78). Not shown in the figure, but may be an optional component is an internal infrared heating element to ensure that the internal cavity temperature does not drop below the ambient atmospheric temperature. This is important in preventing the influx or diffusion of ambient vapors into the clean cell environment.

Figure 3B:
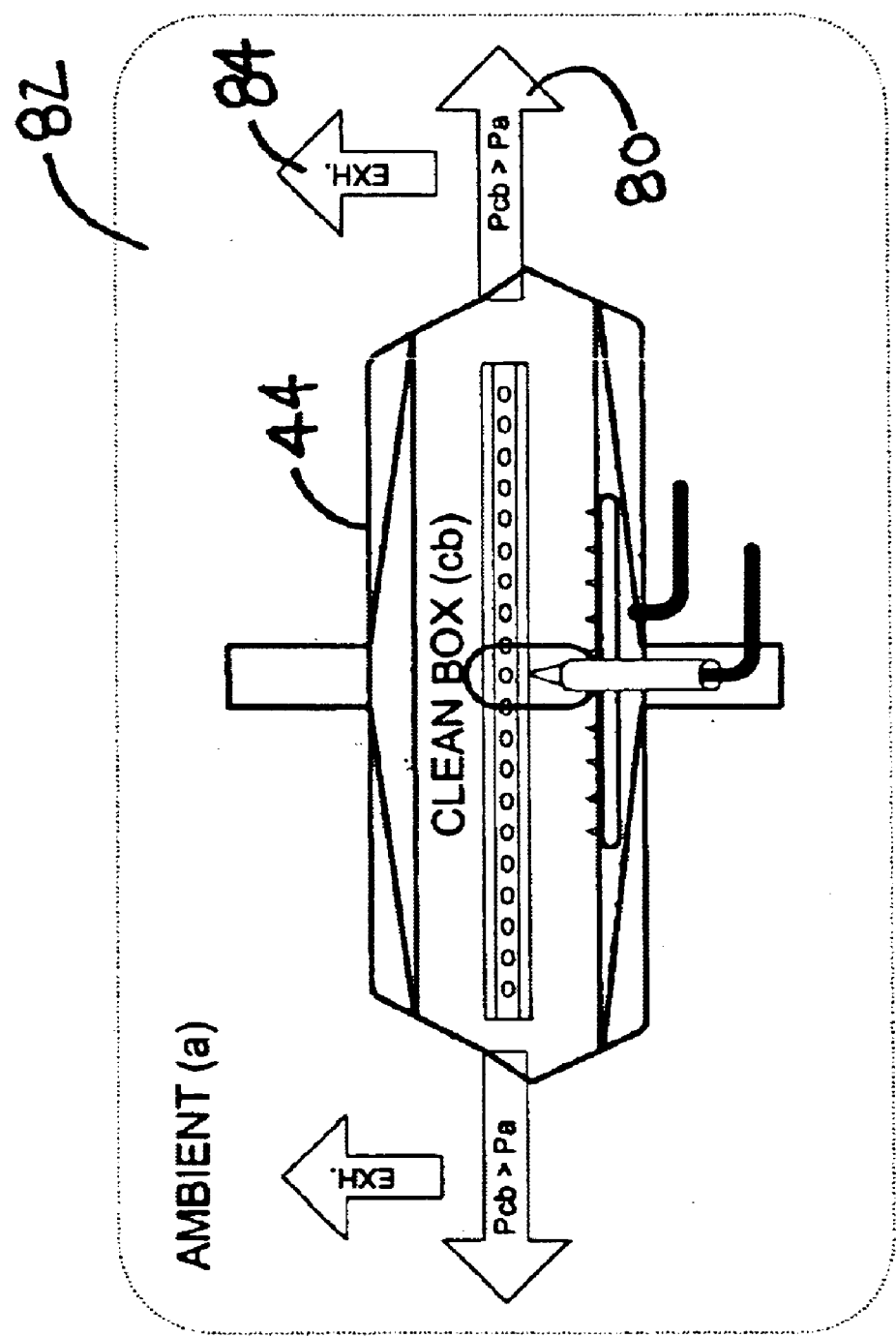
FIG. 3b is a graphical depiction of a top view of the exemplary cleaning cell of FIG. 2a, comparing the cleaning cell internal atmosphere with the ambient atmosphere outside of the cleaning cell environment.

Referring to FIG. 3b, the exemplary clean box (44) as described in FIG. 3a is designed to maintain a positive pressure (80) as compared to the ambient atmosphere (82). A optional localized exhaust system (84) is used to capture escaping atmosphere from the clean box and move the atmosphere outside the vicinity of the clean box or facility.

Figure 4A:
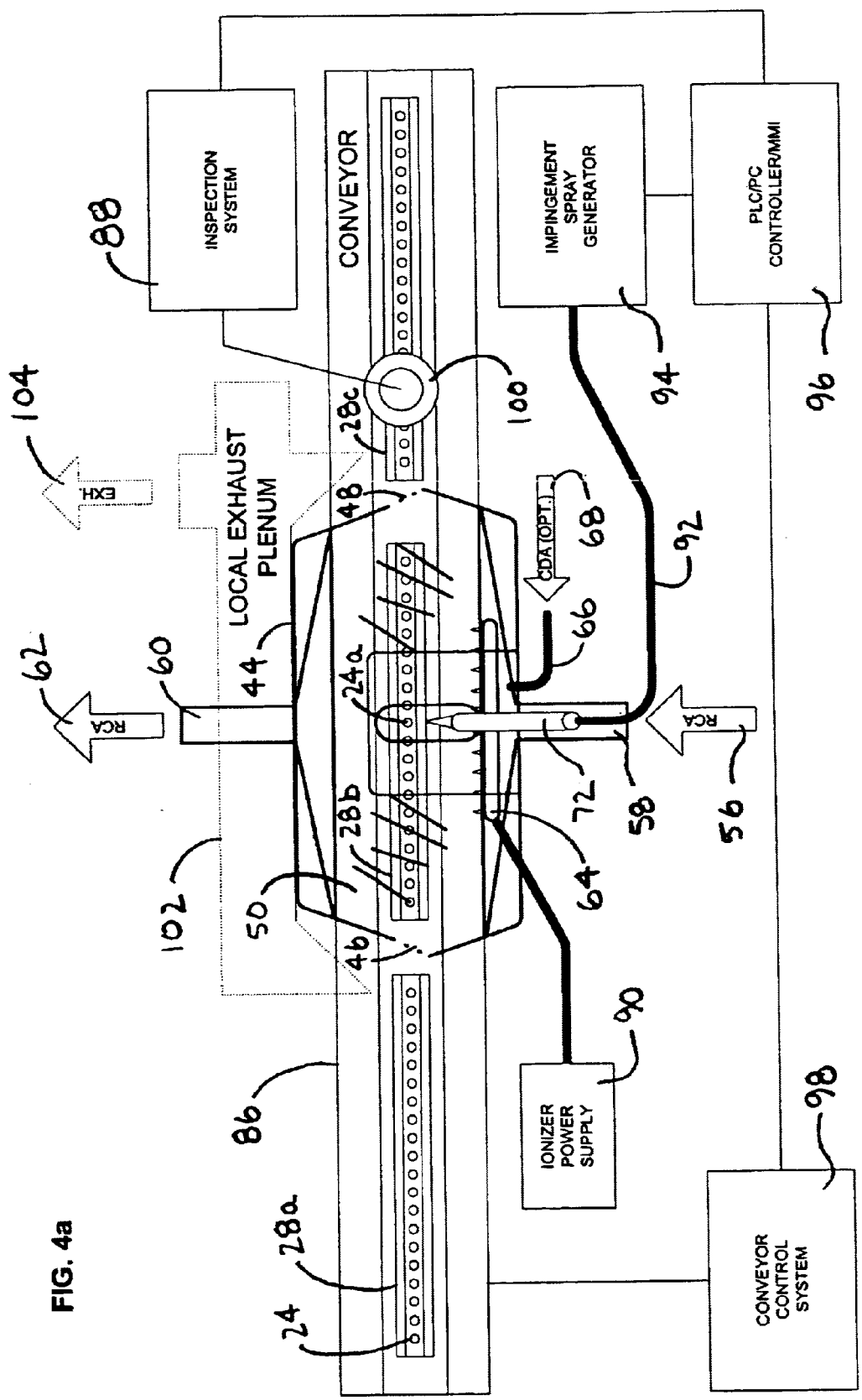
FIG. 4a is a graphical depiction of a top view of an exemplary in-line and conveyorized cleaning cell of FIG. 2a, showing various complimentary components.

Referring to FIG. 4a, the exemplary clean cell described in FIGS. 3a and 3b may be integrated with a conveyor system and other accessories to provide-in-line automated cleaning and inspection. As shown in the figure, the exemplary Auer boat (28a) containing the exemplary photodiode substrates (24) to be cleaned enters the clean cell (44) through an open inlet port (46) whereupon the Auer boat (28b) is scanned at a suitable rate or indexed in succession to align each photodiode (24a) under the cleaning spray nozzle (72). The spray nozzle (72) jet cleans each photodiode contained on the Auer boat (28b) as it passes through the clean cavity (50). Indexing and conveying is performed using a suitable automatic conveyor (86) which traverses the distance from before the inlet port (46), through the interior of the cleaning cell (44), out through the exit port (48) and to an exemplary in-line inspection station (88). The clean cell (44) is continuously re-circulated with regenerated clean atmosphere (56) through inlet pipe (56) from the regenerative blower (not shown). Re-circulated clean air (62) flows from the clean cell (44) through outlet pipe (60) and into the regenerative blower (not shown). An internal ionizer (64) which is connected to a power supply (90) ionizes the entire internal cavity (50) as the clean air recirculates through the cell. The cleaning cell may be purged periodically or continuously with a small amount of purge gas, dependent upon the volume of the cavity, using a purge gas source (68) and through a purge line (66) to maintain a slight positive pressure within the cavity (50). The spray cleaning nozzle (72) is connected through a delivery line (92) which is connected to a cleaning spray generator (94). The exemplary cleaning system is a coaxial spray system, which delivers a mixture of thermal inert gas and cleaning agent (snow particles or steam vapor) and is described in detail in U.S. patent'154 and a pending patent by the present inventor.

Using the exemplary cleaning system provides the positive pressure and inert gas required to properly operate the present invention. The entire system is controlled using a computer or PLC system (96) which is connected and communicates with a conveyor control system (98). The computer/PLC control system indexes the Auer Boat (28a) through the cleaning cell (44), turning on and off the cleaning spray generator (94), and under a surface inspection device (100) to obtain surface cleanliness data from an inspection system (88). The inspection device (100) may be a video inspection camera, an optically stimulated electron emission (OSEE) analyzer or other suitable surface cleanliness verification device. Finally, the clean cell (44) may be further shrouded in an exhaust plenum (102), which is connected to an exhaust duct (104), to capture escaping atmosphere from the inlet port (46) and outlet port (48) of the clean cell (44).

Figure 4B:
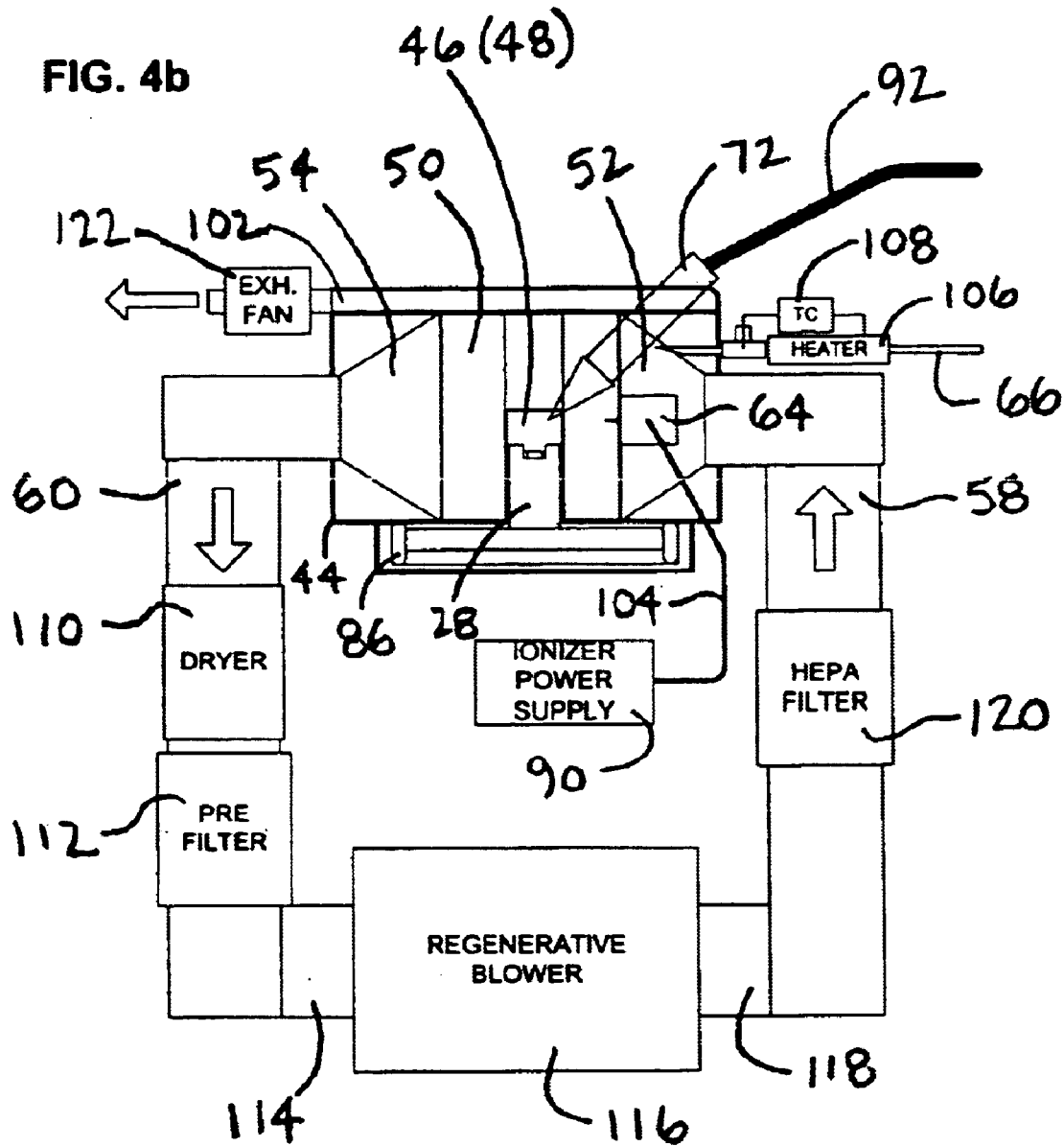
FIG. 4b is a graphical depiction of a side view of a portion of the exemplary in-line and conveyorized cleaning cell of FIG. 3a, showing the re-circulation and filtration system and the internal atmospheric temperature, pressure and ionization control subsystems.

Referring to FIG. 4b, a sectional (center) side view of the exemplary conveyorized cleaning cell shows the integration of key elements of the clean cell system. As shown, the clean cell (44) shrouds the entire assembly, including the conveyor (86) section passing through the cavity (50). The exemplary Auer Boat fixture (28) rides on top of and at the center of the conveyor (86) and passes through an inlet opening (46). The main internal features of the cavity (50) are shown and include the inlet clean gas manifold (52) containing the ionizer (64), which is connected to a power supply (90) via power cable (104), and an inlet purge gas line (66), which is connected to an electric heater (106) and temperature controller (108). The outlet clean air manifold (54) is connected to an outlet flow pipe or duct (60) and is connected to an optional in-line dryer (110) and/or pre-filter cartridge (112) to remove water vapor and particle contamination from the re-circulated atmosphere. The pre-filter may contain activated carbon to absorb any organic vapors present in the air stream. The air stream, optionally pre-treated, flows into the inlet port (114) of a regenerative blower (116) and flows out of the outlet port (118) and through an optional High Efficiency Particulate Air (HEPA) filter (120) and returns to the clean cavity through inlet pipe (58) and into inlet clean air manifold (52). Clean air is continuously regenerated and re-circulated through the cavity during which the Auer Boat (28) carried by the conveyor (86) moves under the cleaning spray applicator (72). The cleaning spray flows through a coaxial delivery line (92) from an external spray generator (not shown) and through the tip of the spray applicator (72). During this operation the atmosphere escaping from the cavity (54) is captured using an exhaust plenum (102) and through an exhaust fan (122).

Figure 5A:
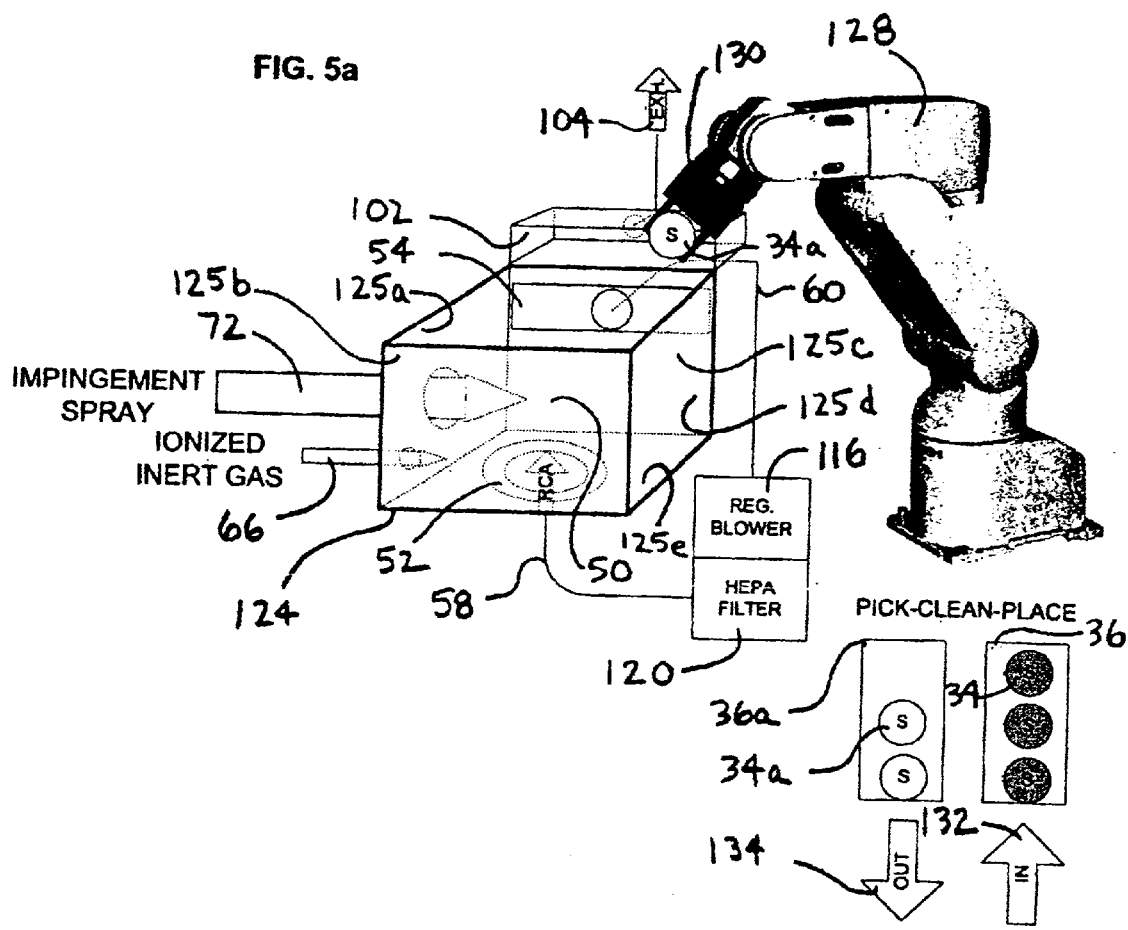
FIG. 5a is a graphical depiction of an isometric view of an exemplary table-top and open-top cleaning cell, shown with an exemplary articulating robot for pick-clean-place substrate processing.

Referring to FIG. 5a, another exemplary clean cell using the method of the present invention is a low cost and simple open-top and table-top cleaning cell. As shown in the figure, the cleaning cell (124) comprises a rectangular box having five sides—four solid vertical side panels (125a, 125b, 125c and 125d) and solid bottom side panel (125e). The bottom side panel (125c) contains an inlet port pipe (58) into which it flows through a air flow diffusing manifold (52) and into the interior of the clean cell (50). The back side panel (125c) contains a outlet air flow manifold (54) located at the upper hemisphere which flows into a outlet pipe (60). Located on top of the back side panel (125c) is an exhaust plenum (102) which is connected to an exhaust line (104). A cleaning spray applicator (72) and an optional purge gas line (66) is affixed to and through a side panel (125a) and into the clean cavity (50). Regenerated and recirculated clean air flows from the cavity (50) through the outlet manifold (54) and outlet pipe (60) into a regenerative blower (116), through a HEPA filter (120), through return inlet clean air pipe (58), through inlet manifold (52) and back into the clean cavity (50). Purge gas flowing from purge pipe (66) maintains a slight positive pressure and dilutes any contaminating vapors contained in the regenerated clean air stream. The escaping atmosphere is captured using the exhaust plenum (102). A robot (128) is employed to pick up exemplary dirty substrates (34) from a tray (36) using a robot gripper (130). The dirty substrates (34) are moved into the interior of the clean cavity (50) and articulated about the front of the spray applicator (72) to clean the substrates to remove particles and thin film contaminants. Clean substrates (34a) are then moved to and placed upon a clean tray (36a). The dirty tray (36) and clean tray (36a) may be automatically or manually placed into position for the robotic pick-clean-place operations as described by an in arrow (132) and out arrow (134).

Figure 5B:
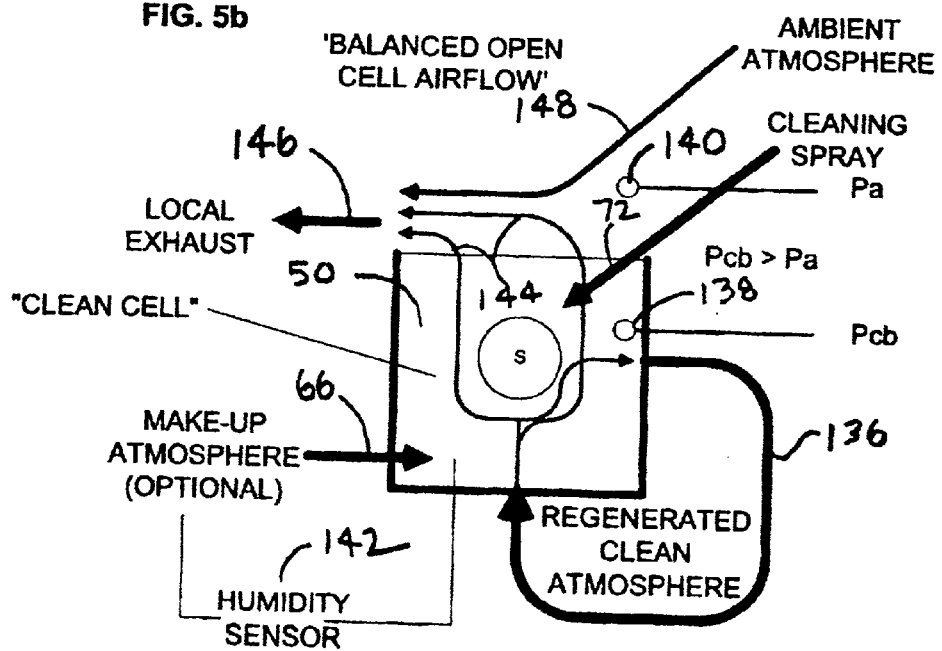

Referring to FIG. 5b, the overall regenerated air flow patterns of the clean cell described in FIG. 5a above are balanced. During continuous recirculation and regeneration operations (136), internal clean cell atmospheric pressure (138), denoted as "Pcb" in the figure, is increased to slightly above ambient pressure (140), denoted as "Pa" in the figure, using excessive atmospheric pressure provided by the cleaning spray applicator (72) and the optional purge gas line (66). As shown, the optional purge gas line (66) may also be connected to a humidity sensor (142) to control the water vapor build-up within the clean cell (50). Escaping internal atmosphere (144) rises to the top of the clean cell and is entrained in an exhaust flow (146), thus providing a sheath flow barrier to prevent the ambient atmosphere (148) from entering the cleaning cell cavity (50).

Figure 6A:
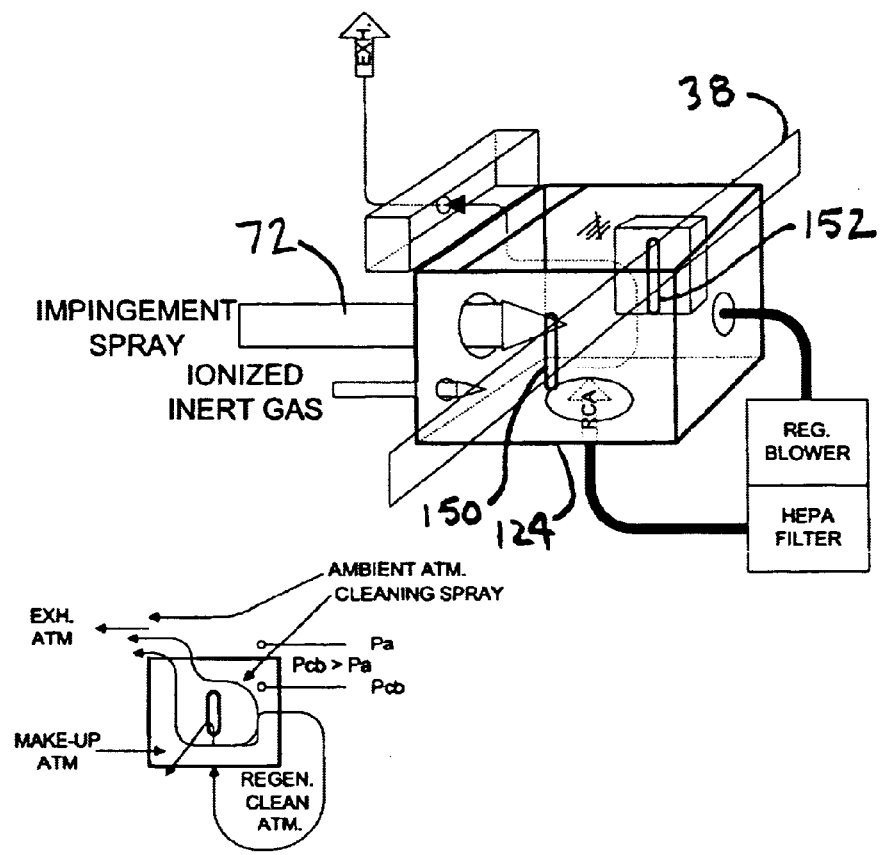
FIG. 6a is a graphical depiction of an isometric view of an exemplary table-top and slotted cleaning cell for use with reel-to-reel substrate processing.

Referring to FIG. 6a, an alternative design to the clean cell thus described in FIGS. 5a and 5b incorporates small slits on the side panels of the cleaning cell (124). A inlet slit (150) and an outlet slit (152) provide for the continuous feed of an exemplary taped or reeled substrate (38) containing lead frames through the interior of the clean cell and in front of the spray cleaning applicator (72). All other features and operations of the present design as shown are equivalent to those described in FIGS. 5a and 5b, including balanced air flow design as shown graphically.

Figure 6B:
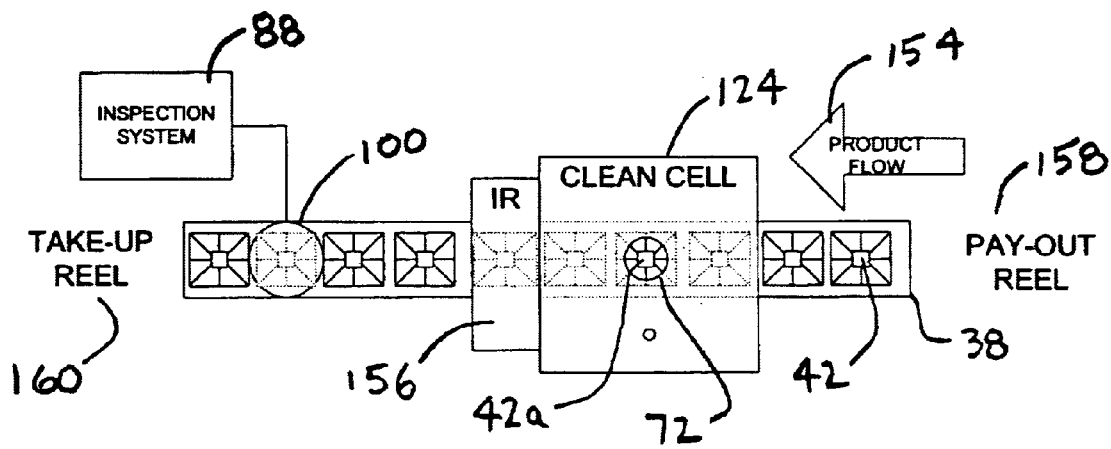
FIG. 6b is a graphical depiction of table-top and slotted cleaning cell of FIG. 5a and adjunct components.

Referring to FIG. 6b, the alternative cleaning cell described in FIG. 6a is a "feed-through" design allowing for continuous processing of substrates contained on a strip, tape or from a reel. As shown, the exemplary substrate (38) containing lead frames (42) to be cleaned in fed continuously in a direction as indicated by product flow arrow (154) through the clean cell (124), upon which a lead frame (42a) as it passes in front of the spray applicator (72) is jet cleaned. Following which, the substrate and cleaned lead frames pass through an infrared heater (156) to increase the substrate temperature above ambient temperature. This operation is useful because it helps maintain the cleanliness of the surface during inspection and during roll up onto a clean reel. The cleaned and heated substrate may be inspected using an inspection system (88) and inspection device (100) such as a video microscope or OSEE as described herein. Using this scheme, a pay-out reel (158) containing dirty substrates (42) passes continuously through the clean cell (124), infrared heater (156) and inspection system (88) and is rolled onto a take-up reel (160).

Figure 7:
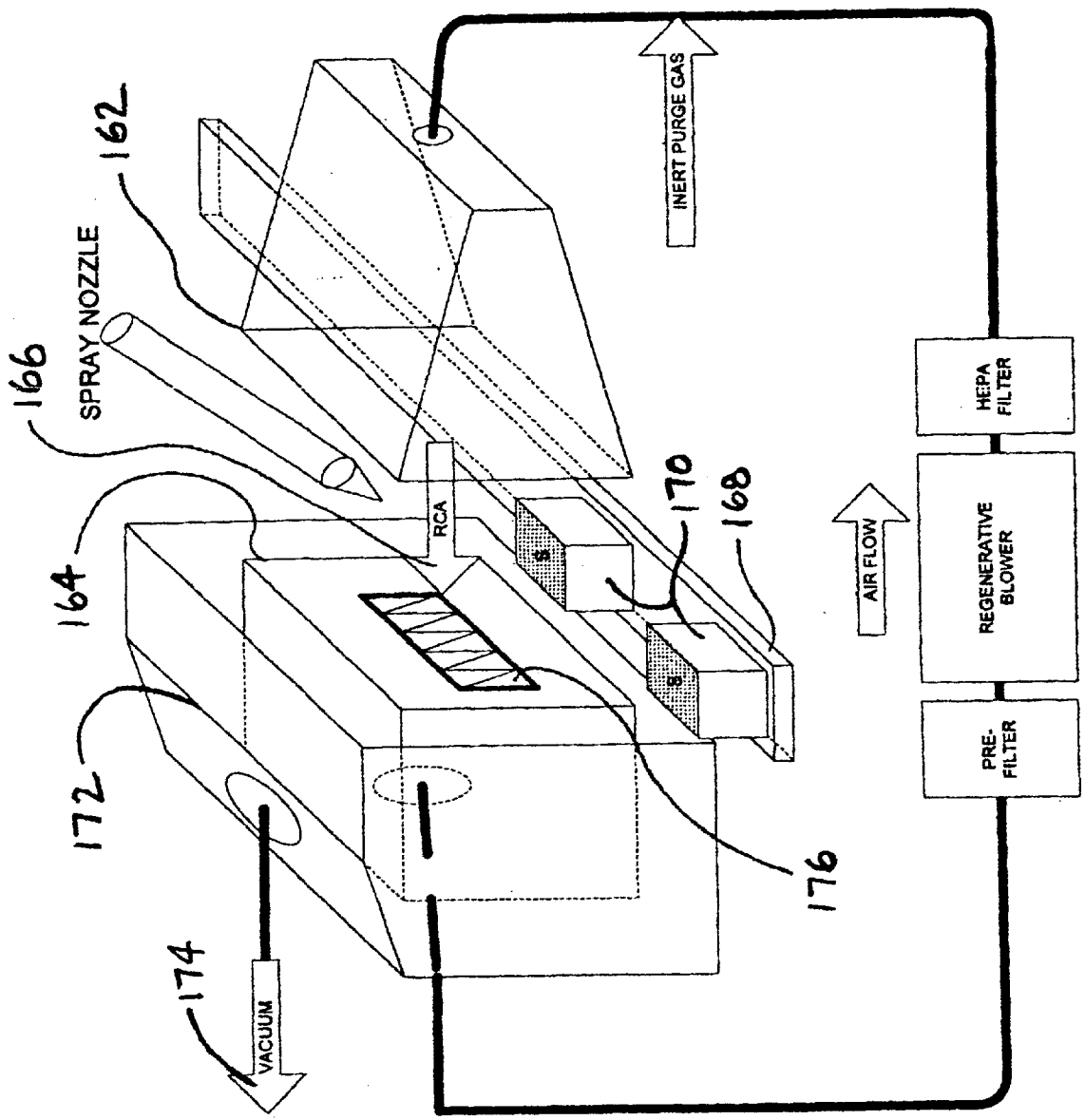
FIG. 7 is a graphical depiction of an open cross-flow cleaning cell with a conveyorized substrate delivery system.

Referring to FIG. 7, an exemplary apparatus of the present invention comprises two opposing manifolds—a clean air outlet manifold (162) and an inlet clean air return manifold (164). In this isometric view, the cleaning cell manifolds are designed to produce a sheath flow of clean dry ionized air between them (166), through which an exemplary conveyor device (168) delivers the substrates (170) to be cleaned within the micro-environment thus created. A local exhaust plenum (172), which is connected to a vacuum source (174) is designed to encompass and incorporate the clean air return manifold (164) to provide an mechanism for uptake of escaping gases from the microenvironment during spray cleaning operations described herein. This type of open cell and open architecture design allows for use with virtually any type of in-line automation tool and substrate fixture device. The devices incorporated into the clean air outlet manifold (162), shown graphically in FIG. 7, to re-cycle and filter clean air, and control positive pressure, temperature, electrostatic discharge and humidity are similar to those of the in-line cleaning cell described above in FIG. 4a and FIG. 4b. As shown graphically, a closed-loop regenerative blower with prefiltration and post-HEPA filtration provides the re-circulation of a majority of the atmosphere within the cleaning cell. Finally, an optional infrared heating element (176) mounted within the clean air return manifold (164) and facing the substrates (170) as they pass through the cleaning cell. This device provides directed infrared heating of the substrates as well as the re-circulating clean air. This ensures that the internal cleaning cell cavity temperature does not drop below the ambient atmospheric temperature. This is important in preventing the influx or diffusion of ambient vapors into the clean cell environment. The heating element (176) is preferably mounted downstream of substrates (170) with the infrared radiation moving in a direction which is opposite to the flow of clean dry air. This design consideration is important in preventing the flow of clean air over the heating structure, which would generate particulate contamination, prior to entering the cleaning cavity. Although the preferred embodiments of the present invention have been shown and described, it should be understood that various modifications and rearrangements may be resorted to without departing from the scope of the invention as disclosed herein.

I claim:

1. An apparatus to be used while treating a surface of a substrate positioned on a surface of a conveyor with a snow or steam spray cleaning device comprising:
   a shroud defining an internal cavity having a longitudinal axis for encasing at least a portion of the conveyor,
   a first inlet in the shroud for providing access to a first location on the conveyor surface;
   an outlet in the shroud, spaced apart from the first inlet, for providing access to a second location on the conveyor surface;
   a clean air plenum disposed within the internal cavity on one side of the conveyor surface and oriented to deliver a laminar sheath of clean air from behind the substrate which flows at an angle which is not incident to the substrate surface;
   a clean air inlet for supplying clean air to internal cavity through the clean air plenum;
   a return air plenum disposed within the internal cavity opposing the clean air plenum;
   an outlet pipe for withdrawing air from the internal cavity through the return air plenum for; and
   a second inlet in the shroud for the snow or spray cleaning device.

* * * * *